United States Patent [19]

Kern et al.

[11] 4,282,535

[45] Aug. 4, 1981

[54] CIRCUIT ARRANGEMENT FOR THE OPERATION OF RECORDING NOZZLES IN INK MOSAIC RECORDING DEVICES

[75] Inventors: Hans Kern, Munich; Reiner Lichti, Germering, both of Fed. Rep. of Germany

[73] Assignee: Siemens Aktiengesellschaft, Berlin & Munich, Fed. Rep. of Germany

[21] Appl. No.: 87,677

[22] Filed: Oct. 24, 1979

[30] Foreign Application Priority Data

Nov. 17, 1978 [DE] Fed. Rep. of Germany ....... 2850016

[51] Int. Cl.³ ...................... G01D 15/18; H01L 41/10

[52] U.S. Cl. ................................ 346/140 R; 310/317

[58] Field of Search .................................. 346/140 R

[56] References Cited

U.S. PATENT DOCUMENTS

| | | | |
|---|---|---|---|
| 3,683,212 | 8/1972 | Zoltan | 346/140 R X |
| 3,968,386 | 7/1976 | Heinzl . | |
| 4,126,867 | 11/1978 | Stevenson, Jr. | 346/140 R |
| 4,161,670 | 7/1979 | Kern | 346/140 R |
| 4,184,168 | 1/1980 | Isayama et al. | 346/140 R |
| 4,189,734 | 2/1980 | Kyser et al. | 346/140 R X |

*Primary Examiner*—George H. Miller, Jr.

*Attorney, Agent, or Firm*—Hill, Van Santen, Steadman, Chiara & Simpson

[57] ABSTRACT

A circuit arrangement for the operation of recording nozzles in ink mosaic recording devices employing tubular drive elements, which contain recording fluid, and which comprise electromechanical transducers, in particular piezo-electric transducers, whose diameter, and thus internal volume varies in the presence of different voltage potentials, utilizing an electronic switch for each of the electromechanical transducers, for selectively supplying to the respective electromechanical transducers a first voltage potential, and an electronic switch common to all of said electromechanical transducers for supplying in common a second voltage potential to all of said electronic transducers. The first voltage potential preferably is a potential operative to expand the diameters of the electromechanical transducers, and said second voltage potential preferably is a potential operative to contract the diameters of the electromechanical transducers. Means may also be provided in the supply path of current conducted across the electronic switch supplying the first voltage potential to the electromechanical transducers for limiting such current in an adjustable manner.

19 Claims, 7 Drawing Figures

FIG 1
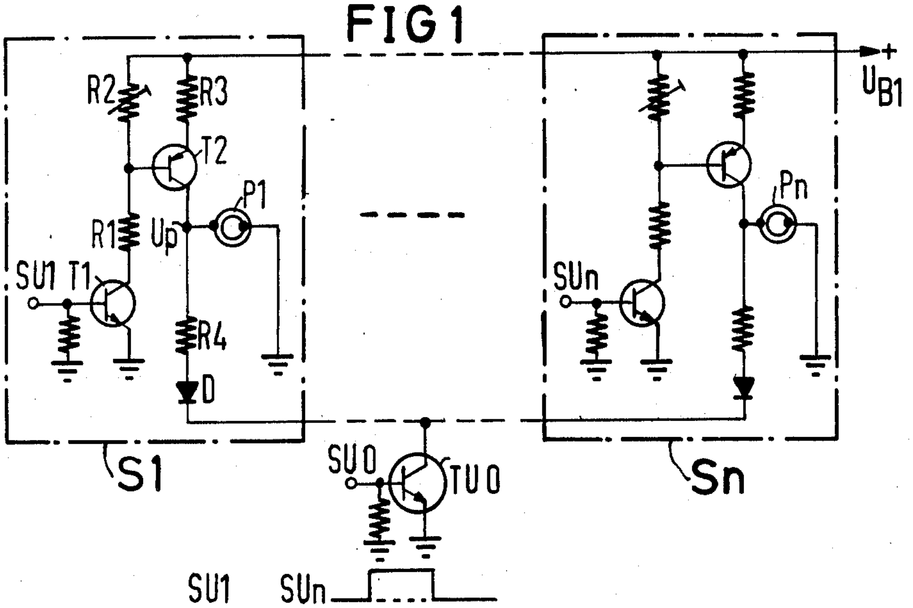
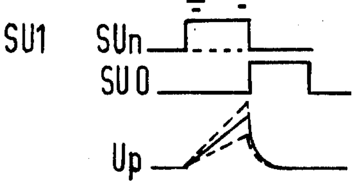
FIG 2
FIG 3
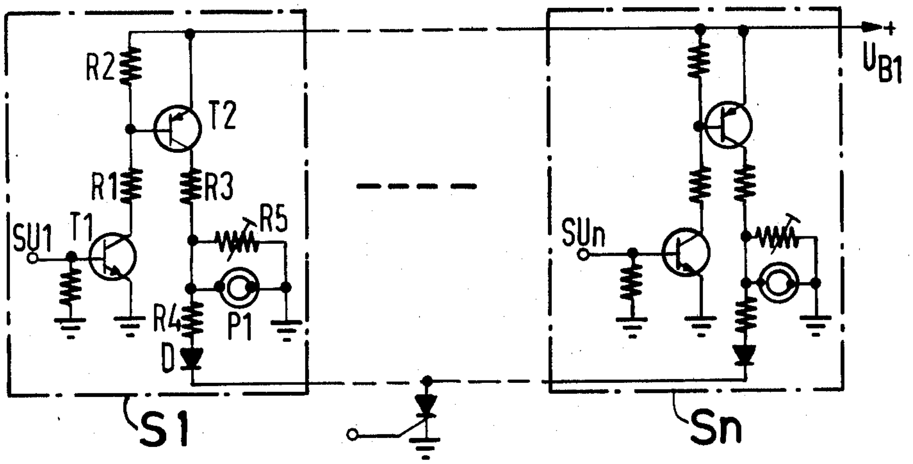
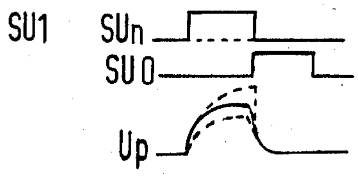
FIG 4

CIRCUIT ARRANGEMENT FOR THE OPERATION OF RECORDING NOZZLES IN INK MOSAIC RECORDING DEVICES

BACKGROUND OF THE INVENTION

The invention relates to a circuit arrangement for operating recording nozzles in ink mosaic recording devices employing tubular drive elements which contain the recording fluid and which comprise electromechanical transducers, particularly piezo-electric tranducers, having a diameter which is variable in response to the application of different electrical voltage potentials applied thereto.

It is known, for example from U.S. Pat. No. 3,683,212, to record information on data carriers utilizing a pulsed device which serves to eject droplets of ink, and which employs a tubular ink receiving chamber which is surrounded by a piezo-electric transducer. The inner volume of such chamber is varied in response to an electric signal, particularly in such a manner that a contraction of the piezo-electric transducer takes place, applying compression forces to the quantity of ink contained within the chamber, resulting in the ejection of a droplet of ink from the associated recording nozzle. In such an arrangement, the ejection of the droplet of ink results from the short circuiting, by means of an electronic circuit arrangement, the applied voltage on the piezo-electric transducer, as a result of which the latter reacts, producing a sudden contraction of the transducer with the accompanying ejection of a droplet of ink. Following such ink ejection, the electronic switching arrangement disconnects the short circuit with respect to the voltage applied to the transducer, so that the latter is again supplied with the original voltage and as a result returns to its expanded state.

A circuit arrangement for operating a piezo-electric transducer is also known from German OS No. 25 48 691 (U.K. Pat. No. 1,510,091) employing an electronic switch which is in a form of a transistor Darlington circuit, in conjunction with a transformer for effecting the operation of the associated piezo-electric transducer. In this arrangement, the ejection cycle for a droplet of ink is initiated by an appropriate operation of the circuit arrangement to first effect an expansion of the drive elements, from their initial rest state, by the connection of an appropriate voltage potential to the piezo-electric transducer. The drive elements are then brought from the expanded state into a contracted state, over the circuit arrangement, by effecting a change in polarization of the control voltage, resulting in ejection of the ink droplets.

When utilizing known arrangements of this type, it is necessary to employ the entire circuit arrangement for each individual-electric transducer to be operated. The two voltage potentials for the piezo-electric transducer are, in this case, connected by the same electronic switching element. The change in potential which must take place for the contraction of the piezo-electric transducer should be particularly noted. As may be ascertained from the known prior art, this change in potential must take place considerably more rapidly than the change in potential which serves to expand the piezo-electric transducer involved. Further, where a large number of piezo-electric transducers are employed, the high voltages and currents which occur are likely to affect the adjacent connection lines.

SUMMARY OF THE INVENTION

The present invention has as one of its principal objects to provide a circuit arrangement for the operation of the electro-mechanical transducers, particularly by piezo-electric transducers, and especially where a large number of transducers are disposed adjacent one another. By means of the circuit arrangement, a mutual influencing of the operating circuits is prevented and it is possible to provide individual operating conditions for the individual recording systems, both during the expansion phase and during the contraction phase.

A circuit arrangement which provides the desired operation comprises, in accordance with the invention, the provision of an electronic switch for each of the electro-mechanical transducers, by means of which it is supplied with a first voltage potential. In addition, an electronic switch is associated, in common, with the respective electronic transducers, by means of which they are supplied with a second voltage potential. By utilization of this arrangement, the different voltage potentials can be connected, independently of one another, with different clearly attainable switching characteristics. Preferably, a circuit arrangement in accordance with the present invention utilizes a first voltage potential by means of which the diameter of each electronic transducer is expanded, and a second voltage potential by means of which the diameter of the electronic transducer is contracted.

Preferably the second voltage potential is a zero potential and is connected to ground.

Thus, with such a circuit arrangement, each electronic transducer, selected to eject a droplet of ink, is initially expanded by the application of such first voltage potential whereby ink fluid is individually received into the associated recording chambers. However, no extension of electromechanical transducers and no inflow of ink fluid takes place in unselected recording chambers from which no ejection of droplets of ink is intended at such time. Disturbance to adjacent lines is unlikely but is at least harmless. In order that the droplets of ink may be ejected from the individual recording chambers, the electromechanical transducers are short-circuited, i.e. are all connected in common to zero potential. If the electronic switch which serves to short-circuit the electrodes of the electromechanical transducers is disposed in the direct vicinity of such transducers, the short-circuiting current paths required are short.

It will be appreciated that known circuit arrangements have heretofore been utilized in the electro-technical field for the purpose of limiting current. In the present arrangement, in accordance with the invention, only those electromechanical transducers which underwent expansion in the first operating phase are capable of contraction and ink droplets are ejected only from such recording chambers associated with the transducers so selected, and in this manner the required letter or character formation can be achieved.

In accordance with a preferred feature of the present invention, the current conducted across the electronic switch, operative to supply the first voltage potential to the electro-mechanical transducer, is limited in an adjustable manner.

Likewise, in accordance with another preferred feature of the present invention, the electromechanical transducer is connected in parallel with an adjustable resistor which, with a further resistor, forms a voltage divider operative to limit the supply of the first voltage potential. One of these features can be utilized to compensate for differences in the switching characteristics of the overall arrangement, and in particular differences in the switching characteristics of the respective electromechanical transducers.

The problem occurs, particularly when a recording head is employed which travels along the recording line, in front of the data carrier, and comprises a plurality of individual recording chambers, that a corresponding number of control lines must lead from the stationary portions of the recording unit to the moving recording head. Both the mechanical outlay and the fact that disturbing influences from adjacent current supplies are likely, unfavorably influence the overall concept. In view thereof, the circuit in accordance with the present invention is further provided, in the direct vicinity of the electronic switches which supply the first voltage potential, with a shift register which is supplied with data pulses and control pulse trains, with the individual stages thereof associated with respective electronic switches which likewise are disposed in the vicinity of the electromechanical transducers.

In connection therewith, it is expedient, in some applications of the invention, to so design the circuit arrangement that a common electronic switch is connected in series with the individual electronic switches supplying the respective electromechanical transducers with the first voltage potential. The shift register contents can be transferred over such common electric switch in order to operate the individual electronic switches.

BRIEF DESCRIPTION OF THE DRAWINGS

In the drawings wherein like reference characters indicate like or corresponding elements:

FIG. 1 is a circuit diagram of a basic circuit for the operation of piezo-electric transducers;

FIG. 2 illustrates the various voltage and pulse relationships of the circuit of FIG. 1;

FIG. 3 is a basic circuit diagram for a further drive circuit for piezo-electric transducers;

FIG. 4 illustrates the various voltage and pulse relationship for the drive circuit of FIG. 3;

DETAILED DESCRIPTION OF THE INVENTION

Figure 5:
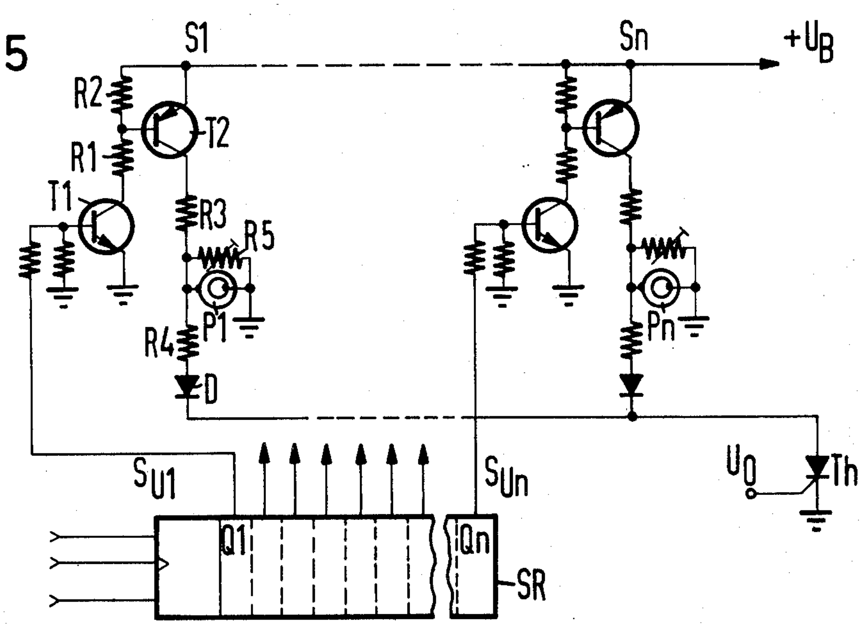
FIG. 5 is a circuit diagram for a drive circuit for piezo-electric transducers, utilizing a series connected shift register.

Referring to the drawings and more particularly to FIG. 1, a plurality of piezo-ceramic transducers P1 to Pn are utilized as mechanical transducers and constitute the drive elements of recording chambers of a mosaic ink recording head, by means of which characters are recorded upon a data carrier by selective ejection of ink droplets from the head.

In the circuit arrangement of FIG. 1, in the event that a droplet is to be ejected by means of a selected piezo-electric transducer P1–Pn, a control signal is supplied to the corresponding inputs SU1–SUn, whereby the associated transistor T2 is rendered conductive over the associated transistor T1. Depending upon the setting of an adjustable resistor R2, in conjunction with an additional resistor R1 formation of a bridge circuit, the base of the transistor T2 is so actuated that the transistor becomes conductive in current limiting manner. As a result, the capacity of the piezo-electric transducer P1 is adjusted to a drive potential corresponding to the connected supply voltage +UB1, of approximately 300 volts, the resistance value of the resistor R3 and of the transistor T2, and the open time of the latter.

As a result, the piezo-electric transducer P1 expands whereby ink fluid is supplied into each selected recording chamber. To effect the ejection of the droplets of ink from the chambers into which ink has been supplied, a control pulse is connected to the input SUO which renders the transistor TUO conductive. As a result, all charged piezo-electric transducers P1–Pn are discharged by a short circuit of their two electrodes over the diodes D, which are present for decoupling purposes. The contraction of the selected piezo-electric transducers P1–Pn, thereby takes place, resulting in an ejection of ink droplets therefrom.

FIG. 3 illustrates a circuit arrangement which has been modified in comparison to that of FIG. 1 in that the bridge resistor R2 connected to the base of the transistor T2 is not adjustable but represents a fixed resistance, so that the transistor T2 acts purely as a switch. The voltage potential to be set up across the piezo-electric transducer P is adjusted by means of an adjustable resistor R5 which is shunted across the piezo-electric transistor, and with the latter connected to the collector of the transistor T2 over a resistor R3. The different charge characteristics UB for the piezo-electric transducer P in the respective circuit arrangements of FIGS. 1 and 3 can be seen by a comparison of FIGS. 2 and 4.

Figure 6:
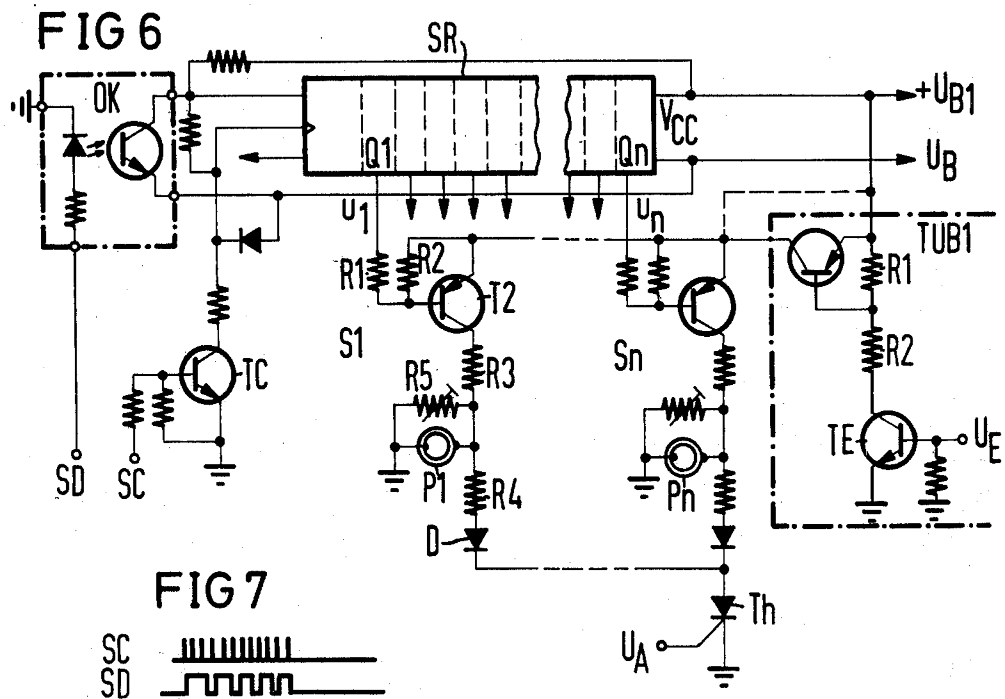
FIG. 6 is a modified control circuit employing a shift register.
Figure 7:
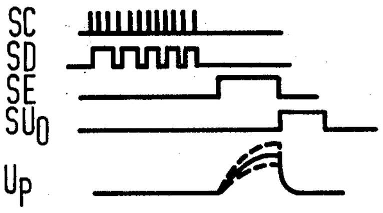
FIG. 7 illustrates the various voltage and pulse relationship for the circuit arrangements of FIGS. 5 and 6.

FIG. 7 illustrates the drive conditions for a circuit arrangement adapted to operate piezo-electric transducers, in conjunction with a shift register. It will be apparent that in the circuit arrangements illustrated in FIGS. 1 and 3, the number of control lines provided must correspond to the number of control inputs SU1 to SUn. The circuit arrangements illustrated in FIGS. 5 and 6 effect a substantial reduction in the line outlay. For this purpose shift registers SR are provided. The drive criteria are supplied to the shift registers in serial fashion over the data input SD, while timing signals are supplied to the input SC. When the shift register SR has fully charged, a control pulse SE is supplied to enable input of the shift register SR in the circuit arrangement illustrated in FIG. 5, whereby the shift register is enabled and the assigned transistors T1 and thus the transistors T2 are actuated in accordance with the setting of the individual shift register stages Q1 to Qn.

In the exemplary embodiment illustrated in FIG. 6, the information is transferred from the shift register SR by the connection of a control pulse to the input UE of the transistor TE which connects the supply voltage UB1 to the transistors T over the transistor TUB1. In FIGS. 3, 5 and 6 a thyristor Th functions as a common switch in place of TUO.

Although we have described our invention by reference to particular illustrative embodiments, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim as our invention:

1. In a circuit arrangement for the operation of recording nozzles in ink mosaic recording devices employing a plurality of tubular drive elements containing recording fluid to be expelled thereby consisting of electromechanical transducers having a diameter and internal volume which vary in the presence of different voltage potentials applied to the transducers, the combination of a first electronic switch for each of the electromechanical transducers, for selectively supplying to the respective electromechanical transducers in sequence a first voltage potential for respectively expanding said transducers, and a second electronic switch common to all of said electromechanical transducers for supplying in common a second voltage potential to all of said electronic transducers for contracting said transducers for expelling said fluid.

2. A circuit arrangement according to claim 1, wherein said means for supplying said second voltage potential is operative to supply zero potential.

3. A circuit arrangement according to claim 1 wherein said second voltage potential is ground potential.

4. A circuit arrangement according to claim 1, comprising in further combination, means in the supply path of current conducted across the first electronic switch supplying the first voltage potential to the electromechanical transducers, for adjustably limiting said current.

5. A circuit arrangement according to claim 1, wherein each electromechanical transducer is connected in parallel with an adjustable resistor and in series with a further resistor, forming a voltage divider which limits the supply of the first voltage potential.

6. A circuit arrangement according to claim 1, employing a recording head which travels along a recording row of nozzles in front of a data carrier therefor, comprising in further combination, a shift register which is disposed in the direct vicinity of the first electronic switches for supplying said first voltage potential to the electromechanical transducers, which shift register is supplied with data pulses and control pulse trains, said shift register having individual stages thereof each operatively connected to a respective one of said first switches.

7. A circuit arrangement according to claim 1, wherein a further common electronic switch is connected in series with each of said first electronic switches which supply the first voltage potential to the electromechanical transducers.

8. A circuit arrangement according to claim 1 wherein said electromechanical transducers are piezoelectric transducers.

9. A circuit arrangement according to claim 1, wherein said electronic switches are disposed in the direct vicinity of the electromechanical transducers.

10. A circuit arrangement according to claim 9, employing a recording head which travels along a recording row of nozzles in front of a data carrier therefore, comprising in further combination, a shift register which is disposed in the direct vicinity of the first electronic switches for supplying said first voltage potential to the electromechanical transducers, which shift register is supplied with data pulses and control pulse trains, said shift register having individual stages thereof each operatively connected to a respective one of said first switches.

11. A circuit arrangement according to claim 10, wherein a further common electronic switch is connected in series with said first electronic switches which supply the first voltage potential to the electromechanical transducers.

12. A circuit arrangement according to claim 11, comprising in further combination, means in the supply path of current conducted across the first electronic switch supplying the first voltage potential to the electromechanical transducers, for adjustably limiting such current.

13. A circuit arrangement according to claim 12, wherein said means for supplying said second voltage potential is operative to supply zero-potential.

14. A circuit arrangement according to claim 13, wherein said second voltage potential is ground potential.

15. A circuit arrangement according to claim 14, comprising means for supplying, as said first voltage potential, a potential operative to expand the diameters of the electro-mechanical transducers, and means for supplying, as said second voltage potential, a potential operative to contract the diameters of the electromechanical transducers.

16. A circuit arrangement according to claim 11, wherein each electromechanical transducer is connected in parallel with an adjustable resistor and in series with a further resistor, forming a voltage divider which limits the supply of the first voltage potential.

17. A circuit arrangement according to claim 16, wherein said means for supplying said second voltage potential is operative to supply zero-potential.

18. A circuit arrangement according to claim 17, wherein said second voltage potential is ground potential.

19. A circuit arrangement according to claim 18, comprising means for supplying, as said first voltage potential, a potential operative to expand the diameters of the electro-mechanical transducers, and means for supplying, as said second voltage potential, a potential operative to contract the diameters of the electromechanical transducers.

* * * * *